US011314555B2

(12) United States Patent
Klein et al.

(10) Patent No.: US 11,314,555 B2
(45) Date of Patent: Apr. 26, 2022

(54) SYNCHRONOUS RE-EXECUTION OF A DATA TRANSFORMATION OPERATION TO OBTAIN FURTHER DETAILS REGARDING AN EXCEPTION

(71) Applicant: INTERNATIONAL BUSINESS MACHINES CORPORATION, Armonk, NY (US)

(72) Inventors: Matthias Klein, Poughkeepsie, NY (US); Timothy Siegel, Staatsburg, NY (US); Anthony T. Sofia, Hopewell Junction, NY (US); Simon Weishaupt, Stuttgart (DE); Bruce C. Giamei, Lagrangeville, NY (US); Louis P. Gomes, Poughkeepsie, NY (US); Mahmoud Amin, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 191 days.

(21) Appl. No.: 16/550,829

(22) Filed: Aug. 26, 2019

(65) Prior Publication Data
US 2021/0064440 A1 Mar. 4, 2021

(51) Int. Cl.
*G06F 9/50* (2006.01)
*H03M 7/30* (2006.01)
*G06F 9/52* (2006.01)

(52) U.S. Cl.
CPC ........... *G06F 9/5066* (2013.01); *G06F 9/52* (2013.01); *H03M 7/702* (2013.01)

(58) Field of Classification Search
CPC .......... G06F 9/5066; G06F 9/52; G06F 9/547; H03M 7/702; H03M 7/6052; H03M 7/30

USPC ........................................................ 718/104
See application file for complete search history.
(Continued)

(56) References Cited

U.S. PATENT DOCUMENTS 6,883,037 B2   4/2005 Kadatch et al.
7,962,700 B2   6/2011 Franaszek et al.
(Continued)

FOREIGN PATENT DOCUMENTS

WO    WO-2009150722 A1 * 12/2009 .......... G06F 11/3476

OTHER PUBLICATIONS

Nakanishi, WO 2009150722 A1 Translation, Dec. 17, 2009, [database online], [retrieved on Apr. 12, 2021] Retrieved from WIPO (Patentscope) using Internet <URL:https://patentscope.wipo.int/search/en/detail.jsf?docId=WO2009150722&tab=FULLTEXT&_cid=P21-KO8OO1-79614-1>, pp. 1-9 (Year: 2009).*
(Continued)

*Primary Examiner* — Meng Ai T An
*Assistant Examiner* — Hsing Chun Lin
(74) *Attorney, Agent, or Firm* — Edward Wixted, Esq.; Kevin P. Radigan, Esq.; Heslin Rothenberg Farley & Mesiti P.C.

(57) ABSTRACT

A processor requests that a data transformation operation be performed using another processor, in which the data transformation operation is performed asynchronously. A determination is made that the data transformation operation performed using the other processor has completed unsatisfactorily, and based on the unsatisfactory completion, status relating to performance of the data transformation operation is incomplete. The data transformation operation is then re-executed synchronously using the one processor, and the re-executing provides status information unavailable in performing the data transformation operation asynchronously.

11 Claims, 8 Drawing Sheets

(56) References Cited

U.S. PATENT DOCUMENTS

| | | | |
|---|---|---|---|
| 8,452,846 | B2 | 5/2013 | Fredette et al. |
| 9,734,911 | B2 | 8/2017 | Sinclair et al. |
| 2004/0205110 | A1* | 10/2004 | Hinshaw ............. G06F 16/2455 709/201 |
| 2007/0198785 | A1* | 8/2007 | Kogge .................... G06F 9/547 711/154 |
| 2008/0244324 | A1* | 10/2008 | Schmelter ............... G06F 9/542 714/38.14 |
| 2011/0106905 | A1 | 5/2011 | Frey et al. |
| 2012/0033893 | A1* | 2/2012 | Arakawa .................. G06K 9/36 382/232 |
| 2016/0011786 | A1* | 1/2016 | Ninose .................. G06F 11/108 711/103 |
| 2020/0341641 | A1* | 10/2020 | Kucherov ........... G06F 13/4221 |

OTHER PUBLICATIONS

IBM, z/VM V6.4 TCP/IP User's Guide, Aug. 2017, [retrieved on Apr. 14, 2021] Retrieved from <URL: https://www.vm.ibm.com/library/640pdfs/64624008.pdf>, pp. 1-556 (Year: 2017).*

IBM, "z/ Architecture—Principles of Operation," IBM Publication No. SA22-7832-11, Twelfth Edition, Sep. 2017, pp. 1-1902.

Mell, Peter and Tim Grance, "The NIST Definition of Cloud Computing," National Institute of Standards and Technology, Information Technology Laboratory, Special Publication 800-145, Sep. 2011, pp. 1-7.

Deutsch, P., "DEFLATE Compressed Data Format Specification Version 1.3," May 1996, pp. 1-15.

Flanigan, L. K., et al., "Reference Material for CCS 476 and CCS 573," University of Michigan, 1972 (no further date information available), downloaded from internet Mar. 12, 2019, pp. 1-199.

* cited by examiner

SYNCHRONOUS RE-EXECUTION OF A DATA TRANSFORMATION OPERATION TO OBTAIN FURTHER DETAILS REGARDING AN EXCEPTION

BACKGROUND

One or more aspects relate, in general, to processing within a computing environment, and in particular, to handling exception conditions resulting from selected processing.

Exception conditions may occur in many types of processing, including, but not limited to, processing associated with compression and decompression operations. In one or more computing environments, a compressed form of information, rather than the original, uncompressed form, is maintained on storage devices. The compressed form occupies less bytes than the original form. As a result, transmitting and maintaining a compressed form of information requires less time and space, respectively, compared to performing the same functions with the original form of the information.

In such environments, an operating system (OS) provides a mechanism to perform the compression and decompression operations. In one example, to provide these operations, the operating system incorporates a zlib open-source software library, which adheres to the DEFLATE standard compression technique, specified in the IETF (Internet Engineering Task Force) RFC (Request for Comments) 1951 specification. Exception conditions may result from the compression/decompression operations, and if such exception conditions do result from the operations, they are to be handled.

SUMMARY

Shortcomings of the prior art are overcome and additional advantages are provided through the provision of a computer program product for facilitating processing within a computing environment. The computer program product includes a computer readable storage medium readable by a processing circuit and storing instructions for performing a method. The method includes requesting, by one processor, that a data transformation operation be performed using another processor. The data transformation operation is to be performed asynchronously. A determination is made that the data transformation operation performed using the other processor has completed unsatisfactorily. Based on the unsatisfactory completion, status relating to performance of the data transformation operation is incomplete. The data transformation operation is re-executed, using the one processor, synchronously, which provides status information unavailable in performing the data transformation operation asynchronously.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

In accordance with one or more aspects, a capability is provided to handle exception conditions resulting from processing, such as resulting from data transformation operations, including but not limited to, compression/decompression operations. In one example, a bi-modal execution environment is provided, in which such exception conditions are handled. For instance, the execution environment is configured to execute particular instructions asynchronously and/or synchronously (i.e., bi-modally). In one particular example, an instruction that performs compression/decompression operations is executed asynchronously, and if one or more exception conditions are encountered based on executing the instruction, the instruction is re-executed synchronously. The synchronous execution enables information regarding the one or more exception conditions to be obtained that would otherwise not be obtained by the asynchronous execution.

One embodiment of a computing environment to incorporate and use one or more aspects of the present invention is described with reference to FIGS. 1A-1D. In one example, the computing environment is based on the z/Architecture® hardware architecture, offered by International Business Machines Corporation, Armonk, N.Y. One embodiment of the z/Architecture hardware architecture is described in "z/Architecture Principles of Operation," IBM Publication No. SA22-7832-11, Twelfth Edition, September 2017, which is hereby incorporated herein by reference in its entirety. z/Architecture is a trademark or registered trademark of International Business Machines Corporation in at least one jurisdiction.

Figure 1A:
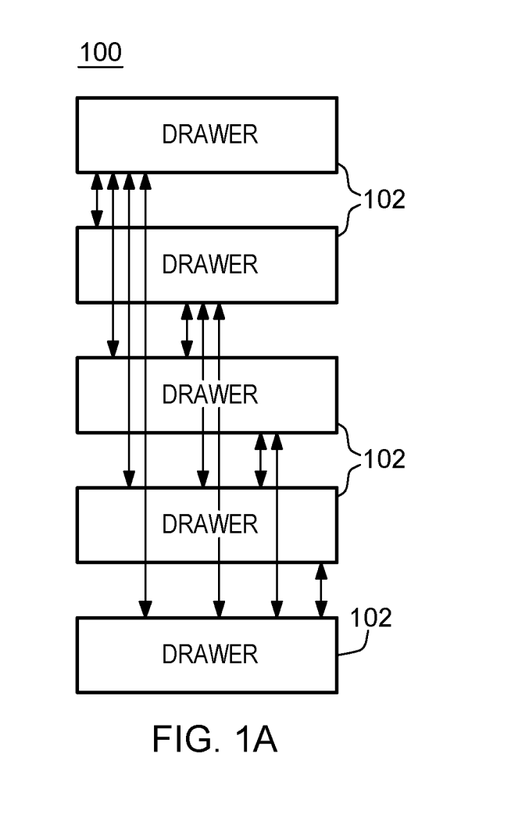
FIG. 1A depicts one example of a plurality of interconnected drawers of a computing environment to incorporate and use one or more aspects of the present invention.
Figure 1B:
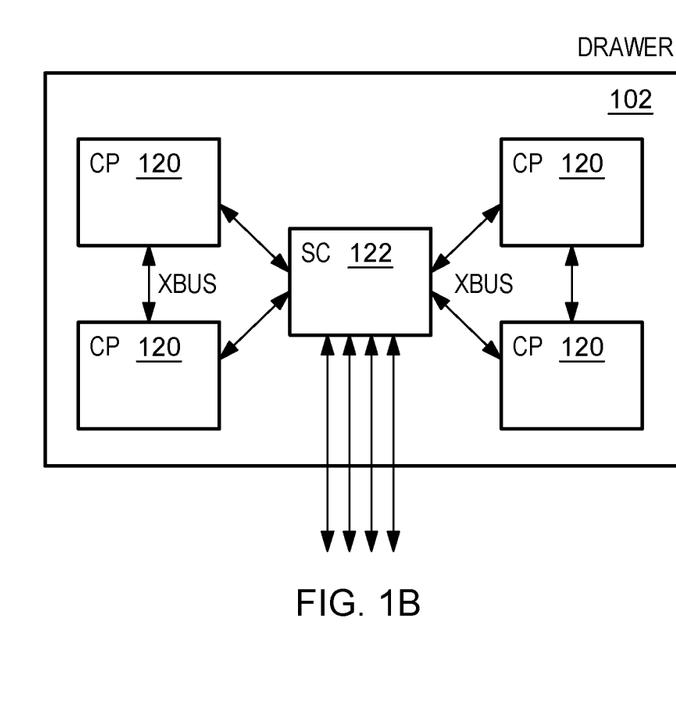
FIG. 1B depicts one example of further details of a drawer of the plurality of interconnected drawers of FIG. 1A, in accordance with one or more aspects of the present invention.

Referring to FIG. 1A, as an example, a computing environment 100 includes a plurality of interconnected drawers 102. A drawer 102, as depicted in FIG. 1B, includes a plurality of central processor (CP) chips 120 coupled to a system controller (SC) 122. System controller 122 is used to interconnect drawers of the plurality of drawers. Further details relating to a central processor chip 120 are described with reference to FIG. 1C.

Figure 1C:
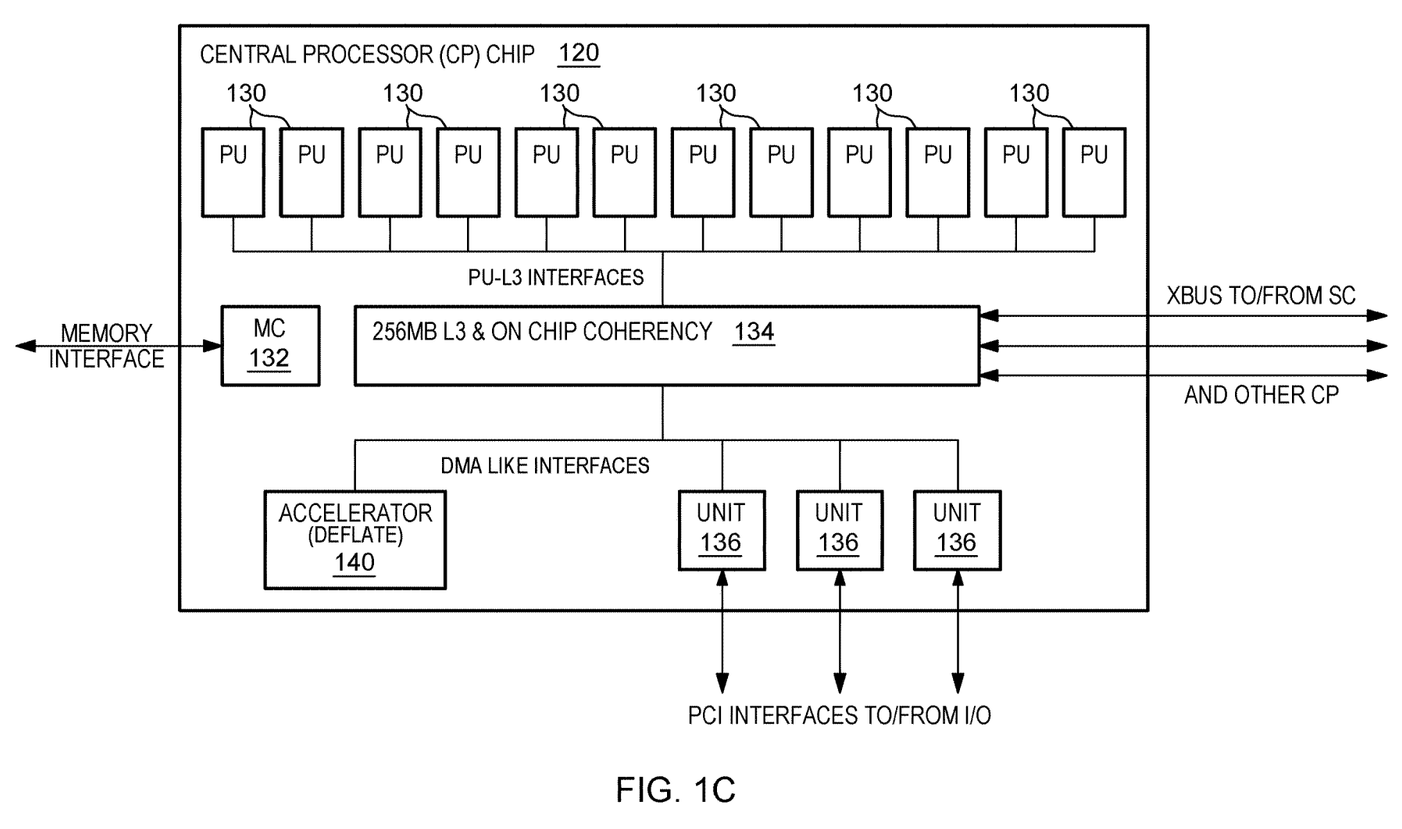
FIG. 1C depicts one example of further details of a central processor (CP) chip of the drawer of FIG. 1B, in accordance with one or more aspects of the present invention.

In one example, central processor chip 120 includes a plurality of processors 130 (also referred to as cores), and a memory controller 132 to control access to memory. Each of the plurality of processors includes one or more private caches, such as L1 and L2 caches, and is coupled to a shared cache 134, such as a shared L3 cache. In one example, shared cache 134 is coupled to a plurality of units 136 that couple on-chip components to PCI (Peripheral Component Interconnect) interfaces to/from input/output devices. Further, in one example, shared cache 134 is coupled to an accelerator 140 that is used, for instance, to perform particular operations (e.g., compression/decompression operations) of an instruction executing on a processor coupled thereto.

Figure 1D:
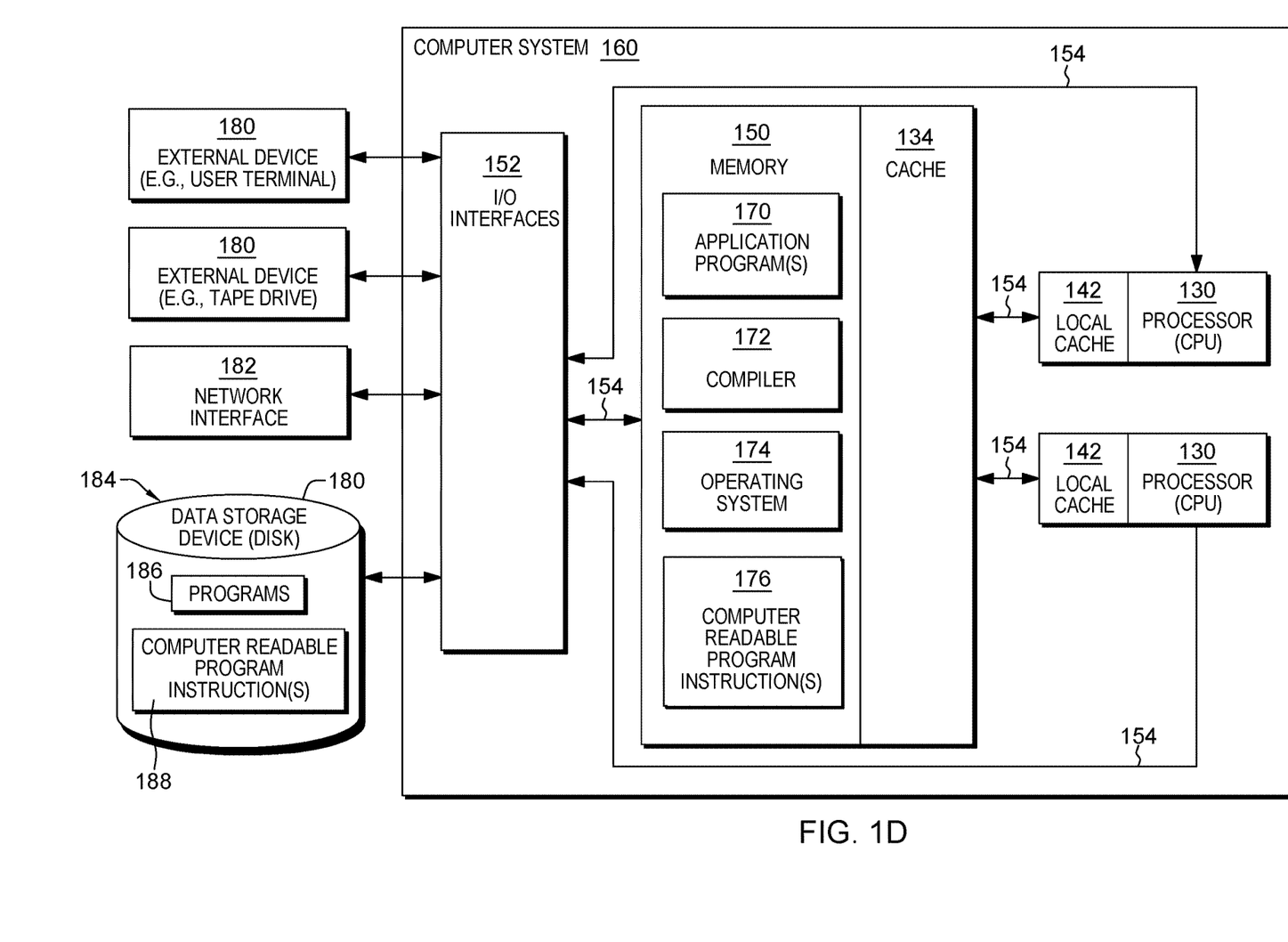
FIG. 1D depicts additional details of one example of the computing environment of FIG. 1A, in accordance with one or more aspects of the present invention.

In one example, as depicted in FIG. 1D, shared cache 134 is coupled to memory 150 (a.k.a., system memory, main memory, main storage, central storage or storage, as examples). Further, memory 150 and processors 130 are coupled to one or more input/output (I/O) interfaces 152 via one or more buses and/or other connections 154. The processors, memory, shared and local caches, I/O interfaces and buses are referred to herein as a computer system 160. Computer system 160 may include additional, fewer and/or different components.

Bus 154 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 150 may include one or more programs or applications 170, a compiler 172, an operating system 174 (e.g., such as a z/OS® or MVS™ (Multiple Virtual Storage) operating system, offered by International Business Machines Corporation, or other operating systems), and one or more computer readable program instructions 176. Computer readable program instructions 176 may be configured to carry out functions of embodiments of aspects of the invention. z/OS and MVS are trademarks or registered trademarks of International Business Machines Corporation in at least one jurisdiction.

Computer system 160 may also communicate via, e.g., I/O interfaces 152 with one or more external devices 180 and/or one or more network interfaces 182. Example external devices include a user terminal, data storage devices, such as a tape drive, disk or other data storage devices, a pointing device, a display, etc. In one particular example, a data storage device 184 may store one or more programs 186, one or more computer readable program instructions 188, and/or data, etc. The computer readable program instructions may be configured to carry out functions of embodiments of aspects of the invention.

Network interface 182 enables computer system 160 to communicate with one or more networks, such as a local area network (LAN), a general wide area network (WAN), and/or a public network (e.g., the Internet), providing communication with other computing devices or systems.

Computer system 160 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 160. Examples, include, but are not limited to: microcode, device drivers, redundant processing units, external disk drive arrays, RAID systems, tape drives, and data archival storage systems, etc.

Computer system 160 may be operational with numerous other general-purpose or special-purpose computing system environments or configurations. Examples of well-known computing systems, environments, and/or configurations that may be suitable for use with computer system 160 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

One or more of processors 130 of computer system 160 and/or central processor chip 120 execute instructions, including instructions that perform compression/decompression operations. An example instruction that performs compression/decompression operations is a DEFLATE Conversion Call instruction implemented in the z/Architecture hardware architecture. The DEFLATE Conversion Call instruction performs functions related to transforming the state of data between the original (uncompressed) form of the data, and a compressed representation of the data, as specified by a selected standard, such as the IETF (Internet Engineering Task Force) RFC (Request for Comments) 1951 specification, which is described in the DEFLATE Compressed Data Format Specification version 1.3 Internet Engineering Task Force, Request for Comments 1951, May 1996. The DEFLATE standard includes descriptions for compressed data symbols which represent duplicate strings in the original form of the data (in the uncompressed form of the data). Such symbols include a pointer and a length of a duplicate string which describe the location and length of the duplicate string, which was previously processed, in relationship to the current location of data being processed. The previously processed uncompressed form of the data is referred to as history. In one example, the history is a contiguous number of bytes in memory, which can be as large as, for instance, 32 K-bytes.

The DEFLATE Conversion Call instruction is a single instruction (e.g., a single architected hardware machine instruction at the hardware/software interface) that is part of a general-purpose processor instruction set architecture (ISA), which is dispatched by a program (e.g., an operating system or a user program) on the general-purpose processor. A program may execute the DEFLATE Conversion Call instruction multiple times to compress or uncompress a single data stream. For instance, when an application compresses or decompresses a large data stream (e.g., greater than 1 M-bytes), the operation may include multiple calls to compress or decompress buffered portions of the data stream.

In one example, a DEFLATE instruction (e.g., a DEFLATE Conversion Call instruction) is implemented as a complex synchronous call, in which code execution waits until return from the call (e.g., return from an accelerator (e.g., accelerator 140) that performs compression/decompression operations of the instruction) to continue processing. Part of the result of the synchronous call is the returning of a detailed and granular description of encountered exception conditions. This leads to general architectural and verification complexity. Based on the general architectural and verification complexity concerns, in accordance with an aspect of the present invention, an asynchronous interface that only supports simplified error and exception reporting, rather than a total set of reporting supported by the synchronous interface, is provided. At the same time, any type of error and exception is still possible and is to be handled properly (e.g., by software) via re-execution of the instruction in the synchronous environment, as described herein.

In accordance with an aspect of the present invention, a lightweight asynchronous execution mode is introduced to complement the complex synchronous instruction call of, e.g., a DEFLATE instruction. This asynchronous execution mode includes simplified error and exception reporting based on known use cases not being expected to generate a lot of error and exception conditions. For instance, the asynchronous execution mode includes only a subset of a plurality of supported calling options available with the synchronous execution. The subset of supported calling options are optimized for a specific set of use cases and are not expected to typically encounter exception cases. As a result, the asynchronous execution mode does not support detailed and granular reporting of exception conditions.

To further explain, as an example, the synchronous mode of execution includes a set of options that may be selected from when issuing and/or executing the instruction (referred to as options, calling options, modes, etc.), examples of which include, for instance: choosing not to provide a complete buffer for input and output data and that processing can be interrupted during the operation and later resumed, which is not supported in the asynchronous mode; compressing data using FHT (fixed-Huffman Table), which is not supported in the asynchronous mode—instead, in the asynchronous mode, a specific sequence is applied to generate a DHT (dynamic-Huffman Table), and then compression is performed asynchronously with the generated DHT; just generating a DHT, which is not supported in asynchronous mode—in asynchronous mode, the DHT is generated and compression is performed with that DHT; in synchronous mode, can specify, e.g., whether hardware is to be close out of the block, whether to disable selected encoding (e.g., LZ77), and/or whether to disable selected history (e.g., over 512 bytes), as well as provide other and/or different options, which are not supported in asynchronous mode. Many other examples are possible.

The simplicity of an abstracted error/exception reporting interface for the mainline asynchronous execution case is combined with the full availability of error/exception isolation of the synchronous instruction call to provide robustness, yet efficiencies, in processing select instructions, such as instructions with certain calling options that perform data transformation operations, including, but not limited to, compression/decompression operations.

As an example, the data that is provided to the asynchronous interface is either decompressed data which will be compressed, or compressed data that will be decompressed. In the case where the operation is decompression, for instance, there are many errors that can be detected in the compressed data stream, as well as an indication of where an error occurred. This information is returned by the instruction, but will not be returned by the asynchronous interface. Other errors that could happen include the output buffer being insufficient for the input, which could happen on the compression or decompression operation.

The asynchronous interface has, for instance, a simple error indicator that is returned that indicates there was an error or other exception when calling the instruction (but does not indicate, e.g., what the error/exception was, or where the error/exception occurred). This will instruct, e.g., the software to re-run the request, but by directly calling the instruction with the data. Calling the instruction directly from, e.g., software removes the real address that is constructed in the parameter block (e.g., based on address translation for the data) for the asynchronous request by directly using host virtual addresses. Then, if the instruction completes successfully when being re-run, that indicates a potential error with the real address mapping of the pages sent to the asynchronous interface. The other possibility is that the instruction fails and returns the detailed error information that was not returned by the asynchronous interface. The detailed error information includes, for instance, an indication of where the error or other exception occurred and/or details regarding the error/exception, such as the type of error, etc.

In one example, to execute the instruction asynchronously, a service assist function is used. As described with reference to FIG. 2, the service assist function may reside within a different drawer than the processor running the application that is to perform compression/decompression operations. In one example, referring to FIG. 2, one drawer 202a (e.g., Drawer X) includes a plurality of central processor chips 220a coupled to a system controller 222a, and another drawer 202b (e.g., Drawer Y) includes a plurality of central processor chips 220b coupled to a system controller 222b.

Figure 2:
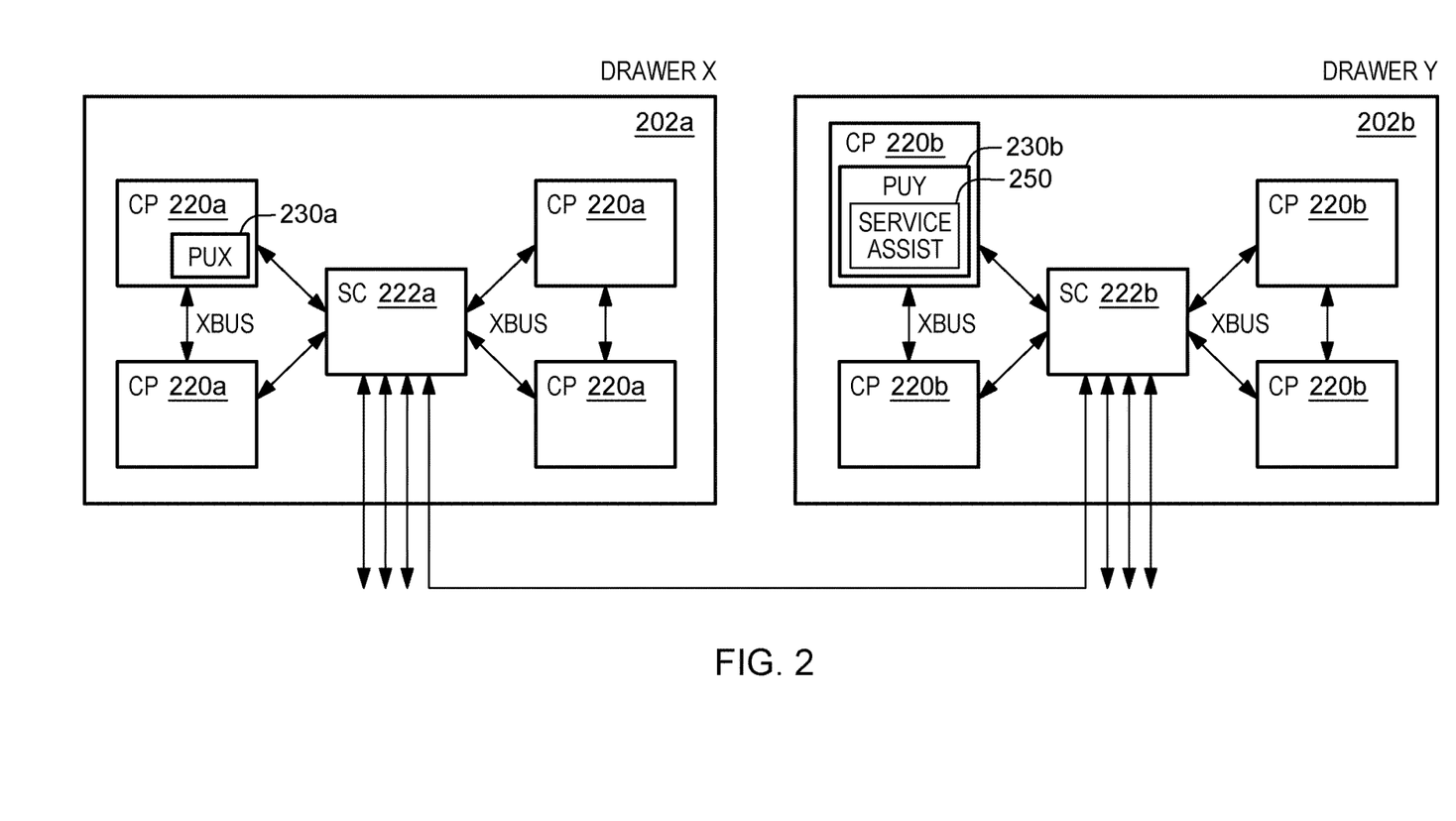
FIG. 2 depicts one example of a processor on a chip of one drawer performing assist functions for an application executing on another chip of another drawer, in accordance with one or more aspects of the present invention.

A processor (PUX) 230a running on one chip 220a of drawer 202a executes an application that is to issue an instruction to perform compression and/or decompression of data, and another processor (PUY) 230b running on another chip 220b of another drawer 202b hosts a service assist function 250 to obtain, via an asynchronous interface, work units of the instruction, including, compression/decompression operations to be performed using the service assist function. In further examples, the application and service assist function may be running on different chips within the same drawer or on the same chip within the same drawer. Other examples are also possible.

Further details relating to executing select instructions (e.g., instructions with certain calling options that perform data transformation operations) in a bi-modal execution environment (e.g., asynchronously and/or synchronously) are described with reference to FIG. 3.

Figure 3:
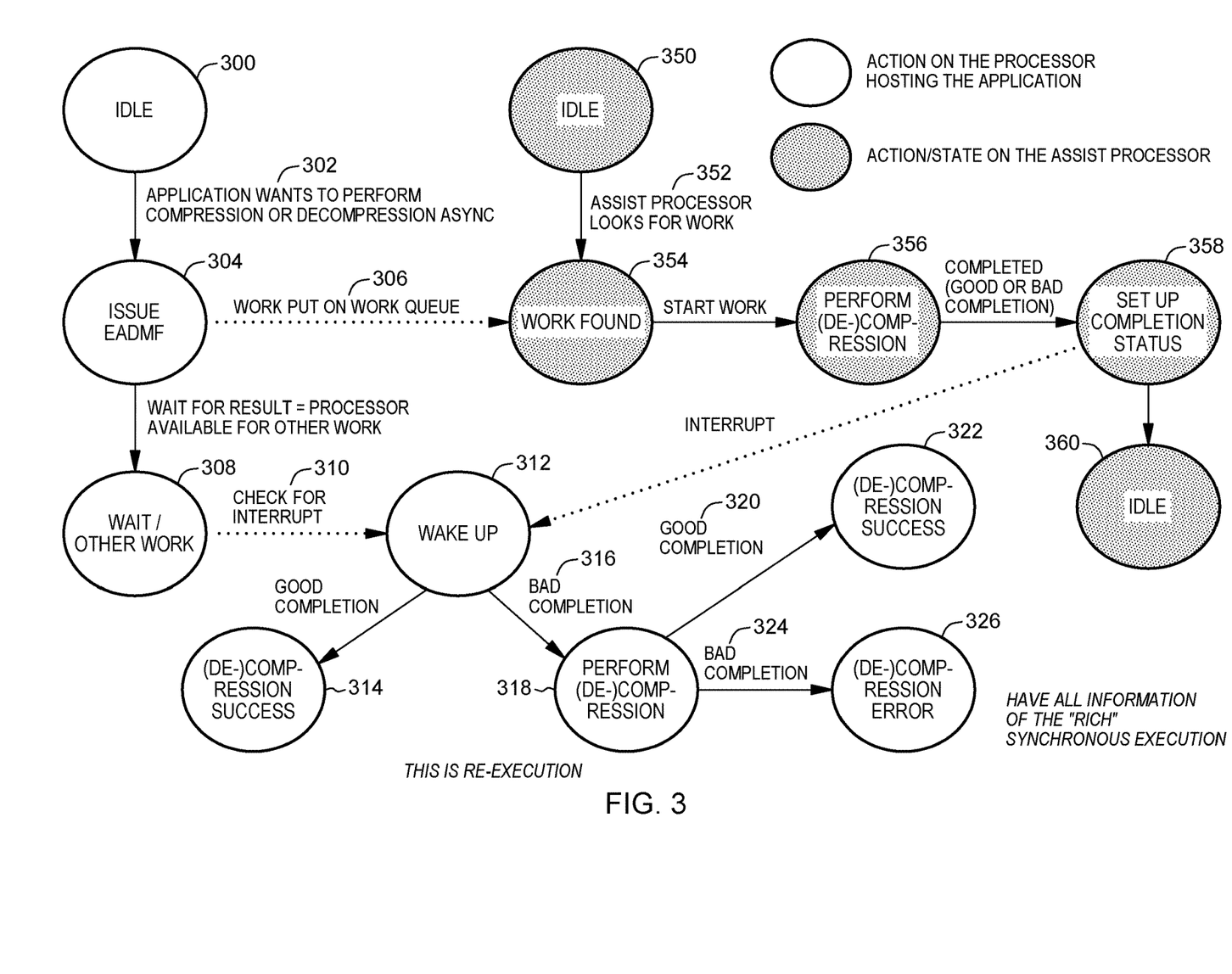
FIG. 3 depicts one example of processing to handle exception conditions in a bi-modal execution environment, in accordance with one or more aspects of the present invention.

Referring to FIG. 3, in one example, a processor (e.g., processor 230a) is at an idle state (300). At some point, processor 230a begins execution of an application that includes an instruction (e.g., a DEFLATE Conversion Call instruction or another instruction with a calling option supported in asynchronous mode) that is to perform a compression or decompression operation asynchronously (302). In accordance with an aspect of the present invention, the application requests asynchronous processing of the instruction. For instance, the application issues (304) an extended asynchronous data move facility (EADMF) request (or other type of request) that places work on a work queue (306) to be performed using another processor, such as an assist processor (e.g., processor 230b that has service assist function 250). The requesting processor (e.g., processor 230a) continues processing other work waiting for a result from the work placed on the work queue (e.g., compression/decompression operations) to be performed using the assist processor (308).

The assist processor (e.g., processor 230b) is, e.g., at an idle state 350 and periodically checks the work queue for work to be performed (352) (and/or receives an indication of work to be performed). Based on having work to be performed (354), the assist processor, at least, initiates the work (356), including performance of one or more requested operations (e.g., compression or decompression operations). The initiating includes, for instance, commencing performance of the work and/or requesting another component (e.g., other processor, device, accelerator, etc.) to perform one or more aspects of the work. The work completes, and the assist processor sets up a completion status (e.g., successful or unsuccessful) (358). Thereafter, the assist processor returns to the idle state (360) and looks for additional work.

At select times, the processor requesting the operations to be performed (e.g., processor 230a) checks for an interrupt (310) and wakes-up or otherwise processes the interrupt (312), based on obtaining the interrupt. A determination is made as to whether the requested operation (e.g., compression or decompression) completed successfully. If there was a successful completion (314), then processing is complete. However, if there was an unsuccessful completion (316), then, in accordance with an aspect of the present invention, no details regarding the exception or error are provided (just that an error or other exception occurred), and thus, the requested operation (e.g., compression or decompression) is re-executed (318). This time, the requested operation is performed synchronously (e.g., one instruction at a time, in which the processor waits for the requested operation(s) to be completed before executing another instruction) using the processor executing the application (e.g., processor 230a), rather than the assist processor (e.g., processor 230b). As examples, processor 230a performs the compression/decompression operations or uses, e.g., an accelerator to perform the operations. However, the processor (e.g., processor 230a) waits for the operations to be performed prior to commencing other work. If the operation is successful (320), then processing successfully completed (322). Further, if the operation is unsuccessful (324), then detailed information relating to the one or more exception conditions (326), which is not available via the asynchronous execution, is obtained. This includes, for instance, where the error/exception occurred and/or type of error, etc.

In one or more examples, the detailed information of the exception conditions is used to correct the application, instruction and/or processing associated therewith in order to successfully perform the requested operation on a future execution of the application and/or instruction. By limiting the details in the asynchronous execution (e.g., to an indication that an error/exception occurred), processing is improved, including performance of the application and/or the processor executing the application. One or more aspects of the present invention are inextricably tied to computer technology and facilitate processing within a computer, improving performance thereof.

Although particular embodiments are described herein. Other variations and embodiments are possible. For instance, other instructions to perform compression/decompression and/or other data transformation operations may benefit from one or more aspects of the present invention.

As indicated, based on an exception condition (e.g., error or other exception), the instruction is re-executed synchronously to obtain the error information. That is, the failure information is not saved in detail during the asynchronous execution, due to the complexity of building an architecture and the testing expense of having complex state returned, and therefore, the instruction is re-executed synchronously. The synchronous interface provides at least the same functionality as the asynchronous interface, and is executed in order to provide the detailed report of the error. Since the synchronous interface provides the detailed information, the asynchronous interface does not provide a complex error and reporting structure and there is less complexity in, e.g., the firmware handling the asynchronous execution and in verification. Any persisting error or exception is isolated to the fullest detail in the synchronous execution and reporting thereof.

Figure 4A:
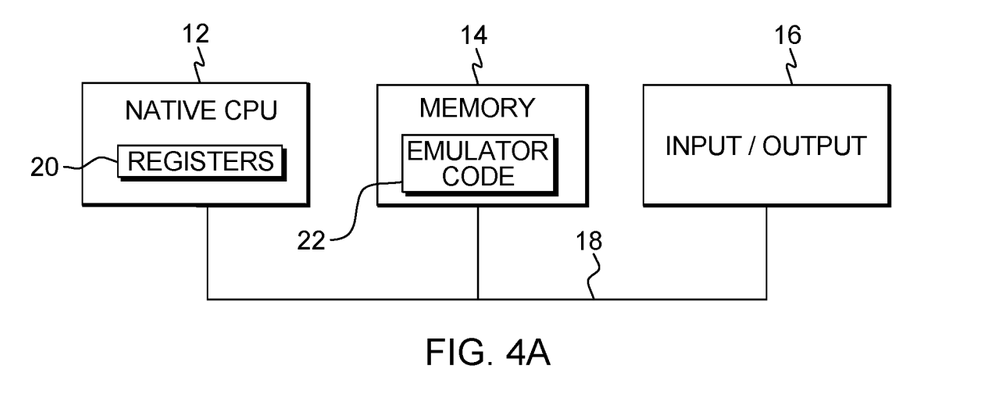
FIG. 4A depicts another example of a computing environment to incorporate and use one or more aspects of the present invention.

Other types of computing environments may also incorporate and use one or more aspects of the present invention, including, but not limited to, emulation environments, an example of which is described with reference to FIG. 4A. In this example, a computing environment 10 includes, for instance, a native central processing unit (CPU) 12, a memory 14, and one or more input/output devices and/or interfaces 16 coupled to one another via, for example, one or more buses 18 and/or other connections. As examples, computing environment 10 may include a PowerPC® processor offered by International Business Machines Corporation, Armonk, N.Y.; and/or other machines based on architectures offered by International Business Machines Corporation, Intel Corporation, or other companies. PowerPC is a trademark or registered trademark of International Business Machines Corporation in at least one jurisdiction. Intel is a trademark or registered trademark of Intel Corporation or its subsidiaries in the United States and other countries.

Native central processing unit 12 includes one or more native registers 20, such as one or more general purpose registers and/or one or more special purpose registers used during processing within the environment. These registers include information that represents the state of the environment at any particular point in time.

Moreover, native central processing unit 12 executes instructions and code that are stored in memory 14. In one particular example, the central processing unit executes emulator code 22 stored in memory 14. This code enables the computing environment configured in one architecture to emulate another architecture. For instance, emulator code 22 allows machines based on architectures other than the z/Architecture hardware architecture, such as PowerPC processors, or other servers or processors, to emulate the z/Architecture hardware architecture and to execute software and instructions developed based on the z/Architecture hardware architecture.

Figure 4B:
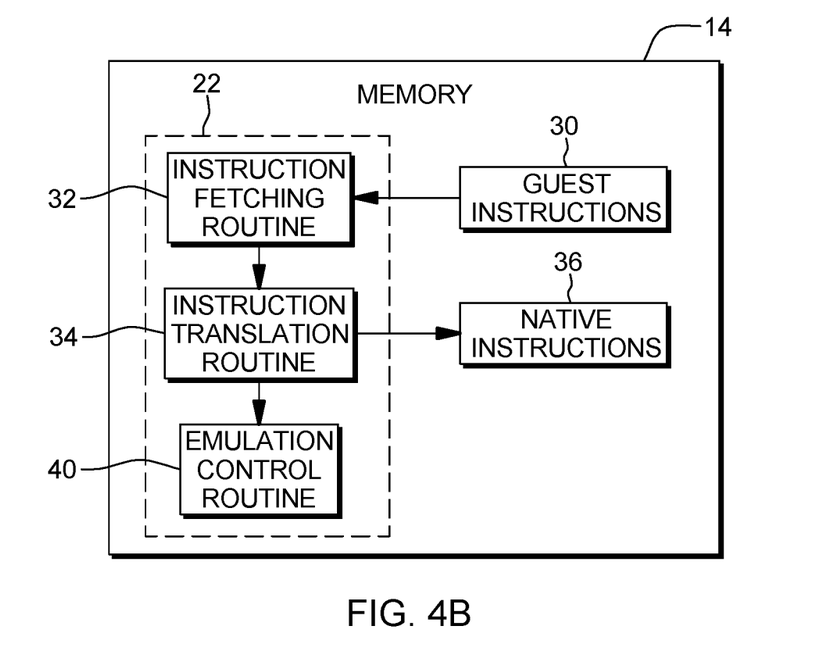
FIG. 4B depicts further details of the memory of FIG. 4A.

Further details relating to emulator code 22 are described with reference to FIG. 4B. Guest instructions 30 stored in memory 14 comprise software instructions (e.g., correlating to machine instructions) that were developed to be executed in an architecture other than that of native CPU 12. For example, guest instructions 30 may have been designed to execute on a z/Architecture processor, but instead, are being emulated on native CPU 12, which may be, for example, an Intel processor. In one example, emulator code 22 includes an instruction fetching routine 32 to obtain one or more guest instructions 30 from memory 14, and to optionally provide local buffering for the instructions obtained. It also includes an instruction translation routine 34 to determine the type of guest instruction that has been obtained and to translate the guest instruction into one or more corresponding native instructions 36. This translation includes, for instance, identifying the function to be performed by the guest instruction and choosing the native instruction(s) to perform that function.

Further, emulator code 22 includes an emulation control routine 40 to cause the native instructions to be executed. Emulation control routine 40 may cause native CPU 12 to execute a routine of native instructions that emulate one or more previously obtained guest instructions and, at the conclusion of such execution, return control to the instruction fetch routine to emulate the obtaining of the next guest instruction or a group of guest instructions. Execution of native instructions 36 may include loading data into a register from memory 14; storing data back to memory from a register; or performing some type of arithmetic or logic operation, as determined by the translation routine.

Each routine is, for instance, implemented in software, which is stored in memory and executed by native central processing unit 12. In other examples, one or more of the routines or operations are implemented in firmware, hardware, software or some combination thereof. The registers of the emulated processor may be emulated using registers 20 of the native CPU or by using locations in memory 14. In embodiments, guest instructions 30, native instructions 36 and emulator code 22 may reside in the same memory or may be disbursed among different memory devices.

As used herein, firmware includes, e.g., the microcode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

A guest instruction 30 that is obtained, translated and executed may be, for instance, one of the instructions described herein. The instruction, which is of one architecture (e.g., the z/Architecture hardware architecture), is fetched from memory, translated and represented as a sequence of native instructions 36 of another architecture (e.g., PowerPC, Intel, etc.). These native instructions are then executed.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 5:
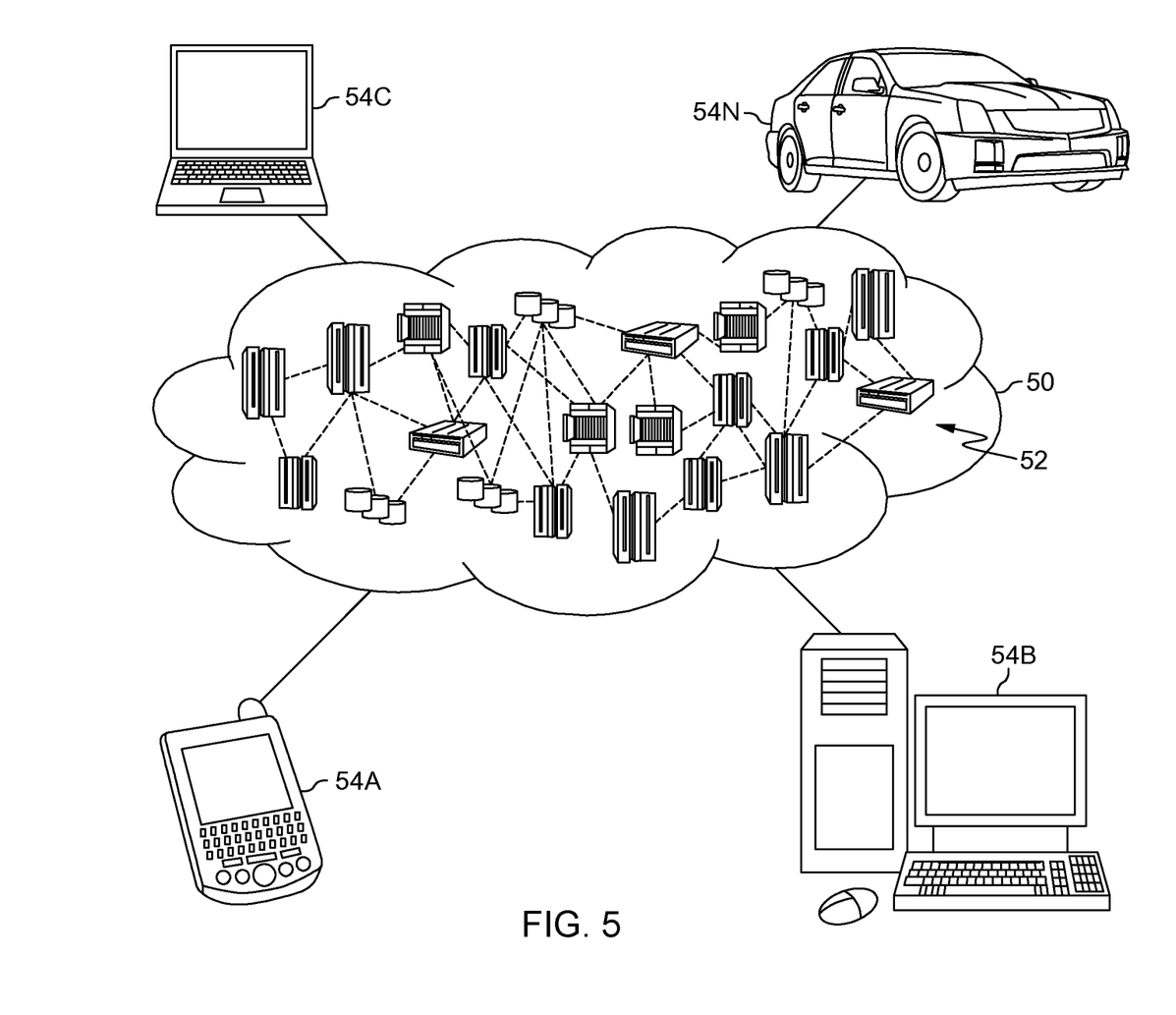
FIG. 5 depicts one embodiment of a cloud computing environment.

Referring now to FIG. 5, illustrative cloud computing environment 50 is depicted. As shown, cloud computing environment 50 includes one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 52 and cloud computing environment 50 can communicate with any type of computerized device over any type of network and/or network addressable connection (e.g., using a web browser).

Figure 6:
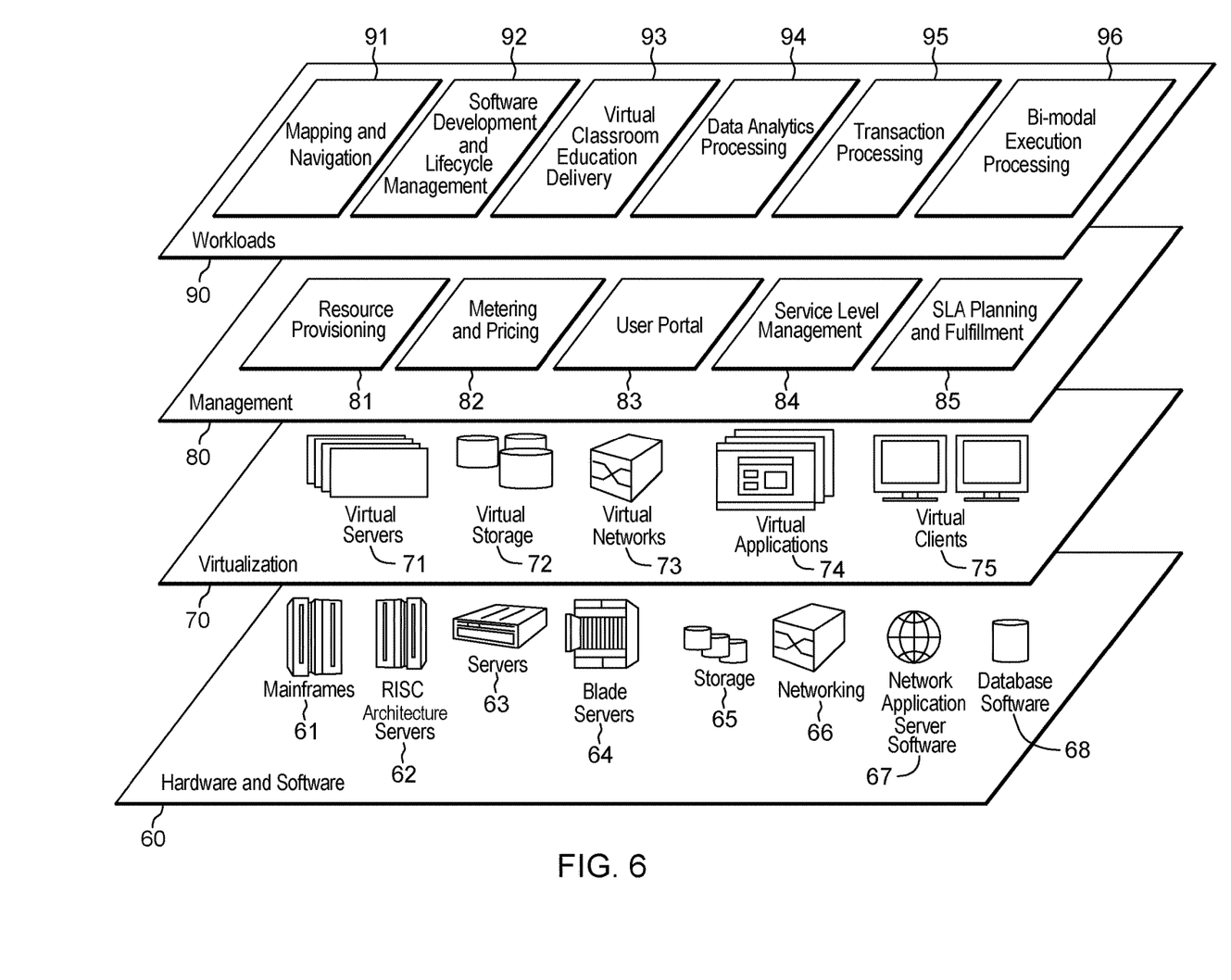
FIG. 6 depicts one example of abstraction model layers.

Referring now to FIG. 6, a set of functional abstraction layers provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and bi-modal execution processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions or operations may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:
  a computer readable storage medium readable by a processing circuit and storing instructions for performing a method comprising:
    requesting, by one processor, that a data transformation operation be performed using another processor, wherein the data transformation operation is to be performed asynchronously by the other processor;
    determining that the data transformation operation performed using the other processor has completed unsatisfactorily, where the determining that the data transformation operation has completed unsatisfactorily comprises obtaining an indication from an asynchronous interface interfacing the one processor and the other processor that an exception has occurred absent further details regarding the exception, and wherein based on the unsatisfactory completion, status relating to performance of the data transformation operation is incomplete; and
    obtaining further details regarding the exception by re-executing, using the one processor, the data transformation operation synchronously, wherein the re-executing comprises:
      calling, by the one processor, an instruction with data to re-execute the data transformation operation, where the calling removes a real address mapping that was constructed in a parameter block for supporting the data transformation operation by the other processor, and where the re-executing directly uses host virtual addresses for the data being transformed using the data transformation operation, avoiding real addressing; and
    wherein where the re-executing by the one processor completes successfully, that indicates a potential error with the real address mapping of data sent to the asynchronous interface when requesting that the data transformation operation be performed using the other processor, and where the re-executing by the one processor is unsuccessful, the re-executing provides status information unavailable in performing the data transformation operation asynchronously using the other processor, including details regarding the exception, including type of the exception and where the exception occurred in performing the data transformation operation.

2. The computer program product of claim 1, wherein the data transformation operation comprises a compression operation or a decompression operation.

3. The computer program product of claim 1, wherein the method further comprises performing the data transformation operation asynchronously using the other processor, wherein the performing the data transformation operation asynchronously includes using a selected option, the selected option being one supported option of a subset of options supported by asynchronous processing, the subset of options being less than a set of options supported by synchronous processing.

4. The computer program product of claim 1, wherein the other processor is an assist processor to at least initiate performance of work, including the data transformation operation, on behalf of the one processor.

5. The computer program product of claim 1, wherein the requesting that the data transformation operation be performed comprises placing work to be performed on a work queue to be obtained by the other processor, the work including the data transformation operation.

6. A computer system for facilitating processing within a computing environment, the computer system comprising:
  a memory; and
  a plurality of processors in communication with the memory, wherein the computer system is configured to perform a method, said method comprising:
    requesting, by one processor, that a data transformation operation be performed using another processor, wherein the data transformation operation is to be performed asynchronously by the other processor;
    determining that the data transformation operation performed using the other processor has completed unsatisfactorily, where the determining that the data transformation operation has completed unsatisfactorily comprises obtaining an indication from an asynchronous interface interfacing the one processor and the other processor that an exception has occurred absent further details regarding the exception, and wherein based on the unsatisfactory completion, status relating to performance of the data transformation operation is incomplete; and
    obtaining further details regarding the exception by re-executing, using the one processor, the data transformation operation synchronously, wherein the re-executing comprises:
      calling, by the one processor, an instruction with data to re-execute the data transformation operation, where the calling removes a real address mapping that was constructed in a parameter block for supporting the data transformation operation by the other processor, and where the re-executing directly uses host virtual addresses for the data being transformed using the data transformation operation, avoiding real addressing; and
    wherein where the re-executing by the one processor completes successfully, that indicates a potential error with the real address mapping of data sent to the asynchronous interface when requesting that the data transformation operation be performed using the other processor, and where the re-executing by the one processor is unsuccessful, the re-executing provides status information unavailable in performing the data transformation operation asynchronously using the other processor, including details regarding the exception, including type of the exception and where the exception occurred in performing the data transformation operation.

7. The computer system of claim 6, wherein the data transformation operation comprises a compression operation or a decompression operation.

8. The computer system of claim 6, wherein the method further comprises performing the data transformation operation asynchronously using the other processor, wherein the performing the data transformation operation asynchronously includes using a selected option, the selected option being one supported option of a subset of options supported by asynchronous processing, the subset of options being less than a set of options supported by synchronous processing.

9. A computer-implemented method of facilitating processing within a computing environment, the computer-implemented method comprising:
   requesting, by one processor, that a data transformation operation be performed using another processor, wherein the data transformation operation is to be performed asynchronously by the other processor;
   determining that the data transformation operation performed using the other processor has completed unsatisfactorily, where the determining that the data transformation operation has completed unsatisfactorily comprises obtaining an indication from an asynchronous interface interfacing the one processor and the other processor that an exception has occurred absent further details regarding the exception, and wherein based on the unsatisfactory completion, status relating to performance of the data transformation operation is incomplete; and
   obtaining further details regarding the exception by re-executing, using the one processor, the data transformation operation synchronously, wherein the re-executing comprises:
      calling, by the one processor, an instruction with data to re-execute the data transformation operation, where the calling removes a real address mapping that was constructed in a parameter block for supporting the data transformation operation by the other processor, and where the re-executing directly uses host virtual addresses for the data being transformed using the data transformation operation, avoiding real addressing; and
   wherein where the re-executing by the one processor completes successfully, that indicates a potential error with the real address mapping of data sent to the asynchronous interface when requesting that the data transformation operation be performed using the other processor, and where the re-executing by the one processor is unsuccessful, the re-executing provides status information unavailable in performing the data transformation operation asynchronously using the other processor, including details regarding the exception, including type of the exception and where the exception occurred in performing the data transformation operation.

10. The computer-implemented method of claim 9, wherein the data transformation operation comprises a compression operation or a decompression operation.

11. The computer-implemented method of claim 9, further comprising performing the data transformation operation asynchronously using the other processor, wherein the performing the data transformation operation asynchronously includes using a selected option, the selected option being one supported option of a subset of options supported by asynchronous processing, the subset of options being less than a set of options supported by synchronous processing.

* * * * *